US010649665B2

(12) United States Patent
Confalonieri et al.

(10) Patent No.: US 10,649,665 B2
(45) Date of Patent: May 12, 2020

(54) DATA RELOCATION IN HYBRID MEMORY

(71) Applicant: Micron Technology, Inc., Boise, ID (US)

(72) Inventors: Emanuele Confalonieri, Lesmo (IT); Marco Dallabora, Melegnano (IT); Paolo Amato, Pagazzano (IT); Danilo Caraccio, Buonalbergo (IT); Daniele Balluchi, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 15/345,919

(22) Filed: Nov. 8, 2016

(65) Prior Publication Data

US 2018/0129424 A1 May 10, 2018

(51) Int. Cl.
| G06F 12/00 | (2006.01) |
| G06F 3/06 | (2006.01) |
| G11C 11/00 | (2006.01) |
| G11C 13/00 | (2006.01) |
| G11C 16/26 | (2006.01) |

(Continued)

(52) U.S. Cl.
CPC ............ *G06F 3/0611* (2013.01); *G06F 3/061* (2013.01); *G06F 3/068* (2013.01); *G06F 3/0647* (2013.01); *G06F 3/0649* (2013.01); *G06F 3/0658* (2013.01); *G06F 3/0685* (2013.01); *G11C 11/005* (2013.01); *G11C 13/004* (2013.01); *G11C 16/26* (2013.01); *G11C 13/0002* (2013.01); *G11C 13/0069* (2013.01); *G11C 16/0483* (2013.01); *G11C 16/10* (2013.01)

(58) Field of Classification Search
CPC .... G06F 3/0611; G06F 3/0647; G06F 3/0658; G06F 3/0685
See application file for complete search history.

(56) References Cited

U.S. PATENT DOCUMENTS

| 7,124,272 B1 | 10/2006 | Kennedy et al. |
| 8,341,339 B1 | 12/2012 | Boyle et al. |
| 8,356,153 B2 | 1/2013 | Franceschini et al. |

(Continued)

FOREIGN PATENT DOCUMENTS

WO 2008073421 A2 6/2008

OTHER PUBLICATIONS

Moinuddin, et al. "Enhancing Lifetime and Security of PCM-Based Main Memory with Start-Gap Wear Leveling" Proceedings of the 42nd Annual IEEE/ACM International Symposium on Microarchitecture, New York, NY, Dec. 2009, 10 pp.

(Continued)

*Primary Examiner* — Gurtej Bansal
(74) *Attorney, Agent, or Firm* — Brooks, Cameron & Huebsch, PLLC

(57) ABSTRACT

The present disclosure includes apparatuses, methods, and systems for data relocation in hybrid memory. A number of embodiments include a memory, wherein the memory includes a first type of memory and a second type of memory, and a controller configured to identify a subset of data stored in the first type of memory to relocate to the second type of memory based, at least in part, on a frequency at which an address corresponding to the subset of data stored in the first type of memory has been accessed during program operations performed on the memory.

33 Claims, 7 Drawing Sheets

(51) Int. Cl.
*G11C 16/04* (2006.01)
*G11C 16/10* (2006.01)

(56) References Cited

U.S. PATENT DOCUMENTS

| | | | |
|---|---|---|---|
| 2002/0056025 A1* | 5/2002 | Qiu | G06F 12/122 |
| | | | 711/133 |
| 2005/0055495 A1 | 3/2005 | Vihmalo et al. | |
| 2008/0140918 A1 | 6/2008 | Sutardja | |
| 2009/0049234 A1* | 2/2009 | Oh | G06F 12/0246 |
| | | | 711/103 |
| 2009/0055575 A1 | 2/2009 | Hanhimaki et al. | |
| 2009/0106518 A1 | 4/2009 | Dow | |
| 2010/0169708 A1 | 7/2010 | Rudelic et al. | |
| 2011/0167197 A1 | 7/2011 | Leinwander | |
| 2012/0047287 A1* | 2/2012 | Chiu | G06F 3/0605 |
| | | | 710/8 |
| 2013/0111160 A1 | 5/2013 | Benhase et al. | |
| 2013/0219105 A1 | 8/2013 | Confalonieri | |
| 2015/0106582 A1* | 4/2015 | Mai | G06F 3/0649 |
| | | | 711/165 |
| 2016/0111642 A1* | 4/2016 | Perniola | G11C 11/005 |
| | | | 257/2 |
| 2016/0162498 A1 | 6/2016 | Hasegawa et al. | |
| 2016/0344629 A1* | 11/2016 | Gray | H04L 45/60 |

OTHER PUBLICATIONS

Chul, et al. "A Hybrid Flash File System Based on NOR and NAND Flash Memories for Embedded Devices", In proceedings of the 8th Annual IEEE Transactions on Computers, vol. 57, Issue 7, Jul. 2008, pp. 1002-1008.

Kim, et al. "A PRAM and NAND Flash Hybrid Architecture for High-Performance Embedded Storage Subsystems", In Proceedings of the 8th ACM International Conference on Embedded Software (EMSOFT 2008), ACM, New York, NY, Oct. 2008, pp. 31-39.

International Search Report and Written Opinion from related patent application No. PCT/US2017/048849, dated Dec. 14, 2017, 15 pp.

Office Action from related Taiwanese patent application No. 106129582, dated May 6, 2019, 9 pages.

Office Action from related Taiwanese patent application No. 106129582, dated Dec. 10, 2018, 18 pp.

Office Action from related Taiwanese patent application No. 106129582, dated Sep. 9, 2019, 23 pages.

* cited by examiner

DATA RELOCATION IN HYBRID MEMORY

TECHNICAL FIELD

The present disclosure relates generally to semiconductor memory and methods, and more particularly, to data relocation in hybrid memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be combined together to form a solid state drive (SSD), an embedded MultiMediaCard (e.MMC), and/or a universal flash storage (UFS) device. An SSD, e.MMC, and/or UFS device can include non-volatile memory (e.g., NAND flash memory and/or NOR flash memory), and/or can include volatile memory (e.g., DRAM and/or SDRAM), among various other types of non-volatile and volatile memory. Non-volatile memory may be used in a wide range of electronic applications such as personal computers, portable memory sticks, digital cameras, cellular telephones, portable music players such as MP3 players, movie players, among others.

Flash memory devices can include memory cells storing data in a charge storage structure such as a floating gate, for instance. Flash memory devices typically use a one-transistor memory cell that allows for high memory densities, high reliability, and low power consumption. Resistance variable memory devices can include resistive memory cells that can store data based on the resistance state of a storage element (e.g., a resistive memory element having a variable resistance).

Memory cells can be arranged into arrays, and memory cells in an array architecture can be programmed to a target (e.g., desired) state. For instance, electric charge can be placed on or removed from the charge storage structure (e.g., floating gate) of a flash memory cell to program the cell to a particular data state. The stored charge on the charge storage structure of the cell can indicate a threshold voltage (Vt) of the cell. A state of a flash memory cell can be determined by sensing the stored charge on the charge storage structure (e.g., the Vt) of the cell.

As an additional example, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

A single level memory cell (SLC) can be programmed to a targeted one of two different data states, which can be represented by the binary units 1 or 0. Some flash and resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1:
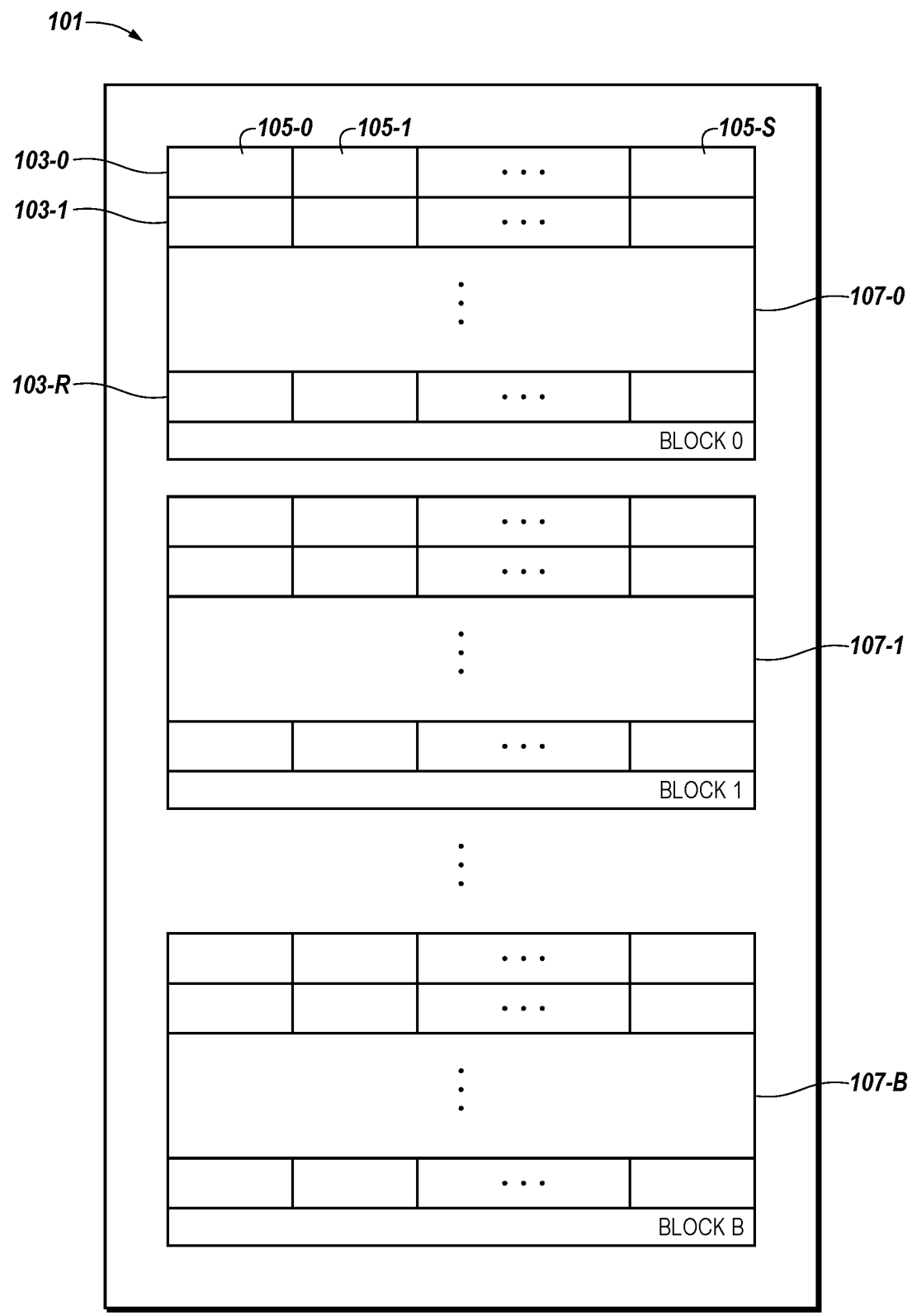
FIG. 1 illustrates a diagram of a portion of a memory array having a number of physical blocks in accordance with a number of embodiments of the present disclosure.

The present disclosure includes apparatuses, methods, and systems for data relocation in hybrid memory. A number of embodiments include a memory, wherein the memory includes a first type of memory and a second type of memory, and a controller configured to identify a subset of data stored in the first type of memory to relocate to the second type of memory based, at least in part, on a frequency at which an address corresponding to the subset of data stored in the first type of memory has been accessed during program operations performed on the memory.

Memory that includes two different types of memory for use as secondary storage (e.g., in addition to and/or separate from main memory such as DRAM or SDRAM), such as the memory described herein, can be referred to as hybrid memory. One of the two types of memory can have a faster access time than the other, and redirecting the programming of small amounts of data to the memory with the faster access time can increase the performance (e.g., increase the speed, increase the reliability, and/or decrease the power consumption) of the hybrid memory. Further, relocating small amounts of data, and/or data that is frequently sensed, from the memory with the slower access time to the memory with the faster access time can increase the performance of the hybrid memory.

In order to effectively increase the performance of the hybrid memory in such a manner, however, it can be beneficial for there to be free space available in the memory with the faster access time to which the data can be programmed and/or relocated (e.g., if the memory with the faster access time is full, no additional data may be programmed and/or relocated there). Embodiments of the present disclosure can effectively identify data being stored in the memory with the faster access time that can be relocated to the memory with the slower access time, and relocate the identified data to the memory with the slower access time, to ensure that free space continuously remains available in the memory with the faster access time and sustain the high performance of the hybrid memory. Further, embodiments of the present disclosure can effectively identify data being stored in the memory with the slower access time that can be relocated to the memory with the faster access time, and relocate the identified data to the memory with the faster access time, to increase the performance of the hybrid memory. Embodiments of the present disclosure can execute the identification and relocation of both of these types of data in synergy, without using data loops which could increase the power consumption and decrease the performance of the hybrid memory.

As used herein, "a number of" something can refer to one or more such things. For example, a number of memory cells can refer to one or more memory cells. Additionally, the designators "R", "B", "S", and "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 306 in FIG. 3.

FIG. 1 illustrates a diagram of a portion of a memory array 101 having a number of physical blocks in accordance with a number of embodiments of the present disclosure. Memory array 101 can be, for example, a NAND flash memory array. As an additional example, memory array 101 can be a storage class memory (SCM) array, such as, for instance, a 3D XPoint memory array, a ferroelectric RAM (FRAM) array, or a resistance variable memory array such as a PCRAM, RRAM, or spin torque transfer (STT) array, among others. Memory array 101 can be part of a hybrid memory, as will be further described herein (e.g., in connection with FIG. 2). Further, although not shown in FIG. 1, memory array 101 can be located on a particular semiconductor die along with various peripheral circuitry associated with the operation thereof.

As shown in FIG. 1, memory array 101 has a number of physical blocks 107-0 (BLOCK 0), 107-1 (BLOCK 1), . . . , 107-B (BLOCK B) of memory cells. The memory cells can be single level cells and/or multilevel cells such as, for instance, two level cells, triple level cells (TLCs) or quadruple level cells (QLCs). As an example, the number of physical blocks in memory array 101 may be 128 blocks, 512 blocks, or 1,024 blocks, but embodiments are not limited to a particular power of two or to any particular number of physical blocks in memory array 101.

A number of physical blocks of memory cells (e.g., blocks 107-0, 107-1, . . . , 107-B) can be included in a plane of memory cells, and a number of planes of memory cells can be included on a die. For instance, in the example shown in FIG. 1, each physical block 107-0, 107-1, . . . , 107-B can be part of a single die. That is, the portion of memory array 101 illustrated in FIG. 1 can be a die of memory cells.

As shown in FIG. 1, each physical block 107-0, 107-1, . . . , 107-B includes a number of physical rows (e.g., 103-0, 103-1, . . . , 103-R) of memory cells coupled to access lines (e.g., word lines). The number of rows (e.g., word lines) in each physical block can be 32, but embodiments are not limited to a particular number of rows 103-0, 103-1, . . . , 103-R per physical block. Further, although not shown in FIG. 1, the memory cells can be coupled to sense lines (e.g., data lines and/or digit lines).

As one of ordinary skill in the art will appreciate, each row 103-0, 103-1, . . . , 103-R can include a number of pages of memory cells (e.g., physical pages). A physical page refers to a unit of programming and/or sensing (e.g., a number of memory cells that are programmed and/or sensed together as a functional group). In the embodiment shown in FIG. 1, each row 103-0, 103-1, . . . , 103-R comprises one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

In a number of embodiments of the present disclosure, and as shown in FIG. 1, a page of memory cells can comprise a number of physical sectors 105-0, 105-1, . . . , 105-S (e.g., subsets of memory cells). Each physical sector 105-0, 105-1, . . . , 105-S of cells can store a number of logical sectors of data (e.g., data words). Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 105-0, 105-1, . . . , 105-S, can store system and/or user data, and/or can include overhead data, such as error correction code (ECC) data, logical block address (LBA) data, and recurring error data.

Logical block addressing is a scheme that can be used by a host for identifying a logical sector of data. For example, each logical sector can correspond to a unique logical block address (LBA). Additionally, an LBA may also correspond (e.g., dynamically map) to a physical address. A logical sector of data can be a number of bytes of data (e.g., 256 bytes, 512 bytes, 1,024 bytes, or 4,096 bytes). However, embodiments are not limited to these examples.

It is noted that other configurations for the physical blocks 107-0, 107-1, . . . , 107-B, rows 103-0, 103-1, . . . , 103-R, sectors 105-0, 105-1, . . . , 105-S, and pages are possible. For example, rows 103-0, 103-1, . . . , 103-R of physical blocks 107-0, 107-1, . . . , 107-B can each store data corresponding to a single logical sector which can include, for example, more or less than 512 bytes of data.

Figure 2:
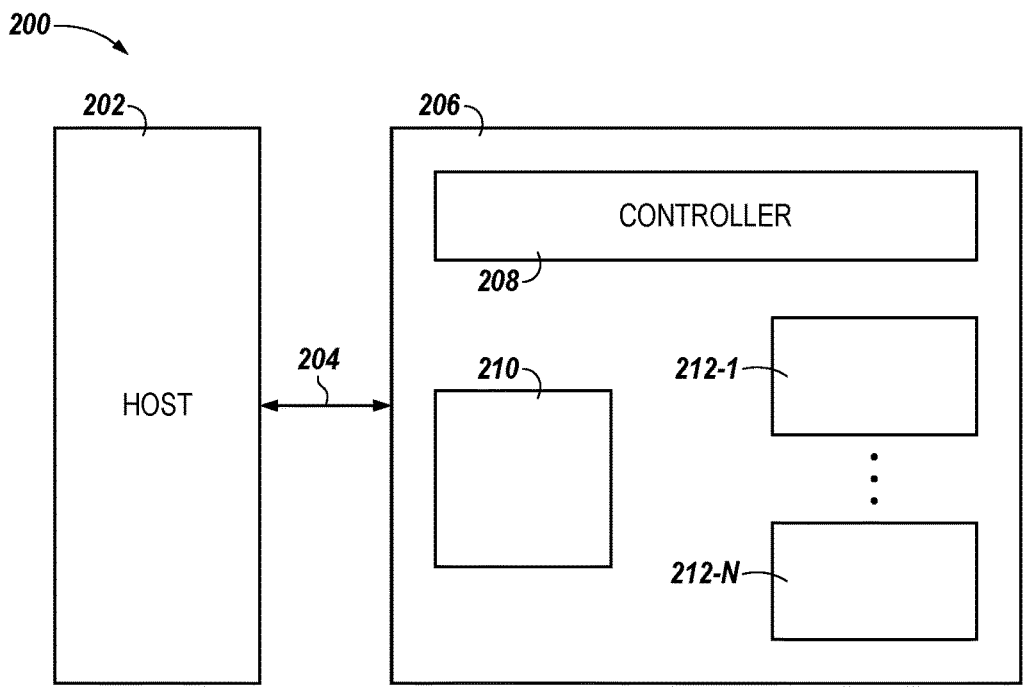
FIG. 2 is a block diagram of a computing system including a host and an apparatus in the form of a memory device in accordance with a number of embodiments of the present disclosure.

FIG. 2 is a block diagram of a computing system 200 including a host 202 and an apparatus in the form of a memory device 206 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. Further, in a number of embodiments, computing system 200 can include a number of memory devices analogous to memory device 206.

In the embodiment illustrated in FIG. 2, memory device 206 can include a first type of memory (e.g., a first memory array 210) and a second type of memory (e.g., a number of second memory arrays 212-1, . . . , 212-N). The memory device 206 can be a hybrid memory device, where memory device 206 includes the first memory array 210 that is a different type of memory than the number of second memory arrays 212-1, . . . , 212-N. The first memory array 210 can be storage class memory (SCM), which can be a non-volatile memory that acts as memory for the memory device 206 because it has faster access time than the second number of memory arrays 212-1, . . . , 212-N. For example, the first memory array 210 can be 3D XPoint memory, FRAM, or resistance variable memory such as PCRAM, RRAM, or STT, among others. The second number of memory arrays 212-1, . . . , 212-N can be NAND flash memory, among other types of memory.

Memory array 210 and memory arrays 212-1, . . . , 212-N can each have a number of physical blocks of memory cells, in a manner analogous to memory array 101 previously described in connection with FIG. 1. Further, memory array 210 and memory arrays 212-1, . . . , 212-N can include (e.g., store) a number of subsets of data. Each respective subset of data can include (e.g., be composed of) system and/or user (e.g., host) data, metadata, and ECC data (e.g., parity bits). Such subsets of data can be referred to herein as large managed units (LMUs), and may include, for example, 4 kB of host data.

Further, memory array 210, and/or memory arrays 212-1, . . . , 212-N, can include (e.g., store) a table of data that includes a number of entries. Each respective entry in the table can correspond to a different one of the number of subsets of data. For instance, each respective entry in the table can include data indicating whether its respective subset of data is stored in memory array 210 and/or memory arrays 212-1, . . . , 212-N, and data indicating the location of its respective subset of data in that array(s), as will be further described herein (e.g., in connection with FIG. 4). Each respective table entry can also include data indicating the frequency at which an address corresponding to its respective subset of data has been accessed during program operations performed on memory arrays 210 and 212-1, . . . , 212-N, as will be further described herein (e.g., in connection with FIG. 4). Such entries can be referred to herein as small managed units (SMUs), and may include, for example, 64 B of data. In a number of embodiments, the size of the table entries can be smaller than the size of the SMUs. In such embodiments, each respective SMU may include multiple table entries.

Although the embodiment illustrated in FIG. 2 includes one memory array of the first type of memory, embodiments of the present disclosure are not so limited. For example, in a number of embodiments, memory device 206 can include a number of SCM arrays. However, memory device 206 may include less of the first type of memory than the second type of memory. For example, memory array 210 may store less data than is stored in memory arrays 212-1, . . . , 212-N.

As illustrated in FIG. 2, host 202 can be coupled to the memory device 206 via interface 204. Host 202 and memory device 206 can communicate (e.g., send commands and/or data) on interface 204. Host 202 can be a laptop computer, personal computers, digital camera, digital recording and playback device, mobile telephone, PDA, memory card reader, interface hub, among other host systems, and can include a memory access device (e.g., a processor). One of ordinary skill in the art will appreciate that "a processor" can intend one or more processors, such as a parallel processing system, a number of coprocessors, etc.

Interface 204 can be in the form of a standardized physical interface. For example, when memory device 206 is used for information storage in computing system 200, interface 204 can be a serial advanced technology attachment (SATA) physical interface, a peripheral component interconnect express (PCIe) physical interface, a universal serial bus (USB) physical interface, or a small computer system interface (SCSI), among other physical connectors and/or interfaces. In general, however, interface 204 can provide an interface for passing control, address, information (e.g., data), and other signals between memory device 206 and a host (e.g., host 202) having compatible receptors for interface 204.

Memory device 206 includes controller 208 to communicate with host 202 and with the first memory array 210 and the number of second memory arrays 212-1, . . . , 212-N. Controller 208 can send commands to perform operations on the first memory array 210 and the number of second memory arrays 212-1, . . . , 212-N. Controller 208 can communicate with the first memory array 210 and the number of second memory arrays 212-1, . . . , 212-N to sense (e.g., read), program (e.g., write), move, and/or erase data, among other operations.

Controller 208 can be included on the same physical device (e.g., the same die) as memories 210 and 212-1, . . . , 212-N. Alternatively, controller 208 can be included on a separate physical device that is communicatively coupled to the physical device that includes memories 210 and 212-1, . . . , 212-N. In a number of embodiments, components of controller 208 can be spread across multiple physical devices (e.g., some components on the same die as the memory, and some components on a different die, module, or board) as a distributed controller.

Host 202 can include a host controller to communicate with memory device 206. The host controller can send commands to memory device 206 via interface 204. The host controller can communicate with memory device 206 and/or the controller 208 on the memory device 206 to read, write, and/or erase data, among other operations.

Controller 208 on memory device 206 and/or the host controller on host 202 can include control circuitry and/or logic (e.g., hardware and firmware). In a number of embodiments, controller 208 on memory device 206 and/or the host controller on host 202 can be an application specific integrated circuit (ASIC) coupled to a printed circuit board including a physical interface. Also, memory device 206 and/or host 202 can include a buffer of volatile and/or non-volatile memory and a register.

In a number of embodiments, controller 208 can identify subsets of data (e.g., LMUs) stored in the first type of memory (e.g., in memory array 210) to relocate (e.g., migrate) to the second type of memory (e.g., memory arrays 212-1, . . . , 212-N) based, at least in part, on the frequency at which the addresses corresponding to the subsets of data stored in the first type of memory (e.g., the frequency at which the LBAs identifying the subsets of data) have been accessed during program operations performed (e.g., executed as a consequence of host write commands) on memory arrays 210 and 212-1, ..., 212-N, and relocate the identified subsets from the first type of memory to the second type of memory. For example, controller 208 can identify a subset of data from among the number of subsets of data stored in the first type of memory that has been accessed least frequently during program operations performed on memory arrays 210 and 212-1, ..., 212-N, and relocate that subset of data to the second type of memory. The identification and relocation can be performed using the data in the table stored in memory array 210, and will be further described herein.

Further, in a number of embodiments, controller 208 can identify subsets of data stored in the second type of memory to relocate to the first type of memory based, at least in part, on the amount of data sensed during sense operations (e.g., the amount of data requested by host read commands) performed on the subsets of data stored in the second type of memory and/or the frequency at which the addresses corresponding to the subsets of data stored in the second type of memory have been accessed during sense operations performed on memory arrays 210 and 212-1, ..., 212-N, and relocate the identified subsets from the second type of memory to the first type of memory. For example, controller 208 can determine whether the amount of data sensed during a sense operation performed on a subset of data stored in the second type of memory meets or exceeds a particular threshold, and relocate that subset of data to the first type of memory upon determining the amount of data does not meet or exceed (e.g., is less than) the particular threshold. The identification and relocation will be further described herein.

The embodiment illustrated in FIG. 2 can include additional circuitry, logic, and/or components not illustrated so as not to obscure embodiments of the present disclosure. For example, memory device 206 can include address circuitry to latch address signals provided over I/O connectors through I/O circuitry. Address signals can be received and decoded by a row decoder and a column decoder, to access memory arrays 210 and 212-1, ..., 212-N. Further, memory device 206 can include a main memory, such as, for instance, a DRAM or SDRAM, that is separate from and/or in addition to memory arrays 210-1 and 212-1, ..., 212-N.

Figure 3:
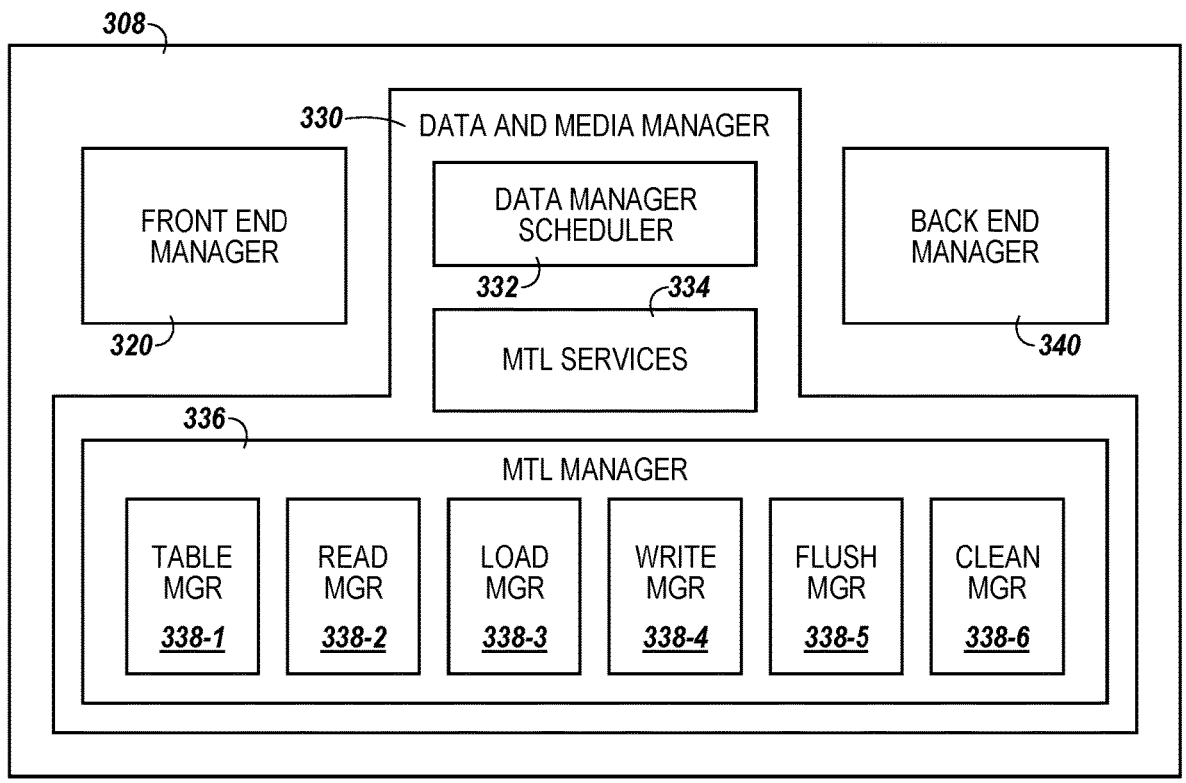
FIG. 3 illustrates a controller on a memory device in accordance with a number of embodiments of the present disclosure.

FIG. 3 illustrates a controller 308 on a memory device in accordance with a number of embodiments of the present disclosure. Controller 308 can be, for example, controller 208 on memory device 206 previously described in connection with FIG. 2. For instance, controller 308 can communicate with a host (e.g., host 202 in FIG. 2) and/or memory arrays (e.g., first memory array 210 and/or the number of second memory arrays 212-1, ..., 212-N in FIG. 2) to read, write, move, and/or erase data to and/or from the host and/or memory arrays.

As shown in FIG. 3, controller 308 can include a front end manager module 320, a data and media manager module 330, and a back end manager module 340. Front end manager 320 can receive commands from a host and interpret those commands. Front end manager 320 can perform a translation of the logical addresses of data associated with the commands. As used herein, a "module" can include hardware, firmware, software, and/or logic that can be used to perform a particular function.

Data and media manager 330 can further process commands received from a host. Data and media manager 330 can include data manager scheduler module 332, media translation layer (MTL) services module 334, and MTL manager module 336. Data manager scheduler 332 can determine when each of the commands received from a host will be performed. MTL services 334 can include a number of sets of application programming interface (API) instructions to provide functionality to the MTL manager 336. For example, MTL services 334 can include API instructions to perform logical address to physical address translation, read data from memory arrays, and/or write data to memory arrays, among other services.

As shown in FIG. 3, MTL manager 336 can include table manager module 338-1, read manager module 338-2, load manager module 338-3, write manager module 338-4, flush manager module 338-5, and clean manager module 338-6 to perform operations on the memory arrays. Table manager 338-1 can provide and manage information (e.g., data) that can be used to locate data (e.g., subsets of data) stored in the memory arrays and identify the frequency at which addresses (e.g., LBAs) corresponding to data (e.g., subsets of data) stored in the memory arrays has been accessed during program operations. This information can be stored in a table in one of the types of memory arrays (e.g., array 210). For example, the table can include a number of entries, with each different entry including data indicating the location of a respective subset of data in the memory arrays and data indicating the frequency at which the address corresponding to that respective subset has been accessed during program operations.

For example, table manager 338-1 can provide logical address to physical address mapping for the logical blocks stored in the physical memory arrays of memory device 206 by generating and storing a logical to physical table for the data in the first type of memory (e.g., array 210). The logical to physical table can include a bit or bits in the logical address to physical address mapping that indicates whether the data is stored in the first type of memory (e.g., array 210) and/or the second type of memory (e.g., arrays 212-1, ..., 212-N). Such bits can be referred to herein as residency data or residency bits, and will be further described herein (e.g., in connection with FIG. 4). The table manger 338-1 can also generate and store logical to physical pointers to locate the data in the memory arrays.

Further, table manager 338-1 can provide the frequency information for the data stored in the memory arrays by using a counter to generate and store a bit or bits in the table indicating whether, and/or how often, the data has been accessed during program operations performed on the memory arrays. Such bits can be referred to herein as hotness data or hotness bits, and will be further described herein (e.g., in connection with FIG. 4). These hotness bits can also be updated during operation of the memory. For instance, the hotness bits for a subset of data can be periodically decremented during operation of the memory, and/or can be incremented upon the subset being accessed during a program operation, as will be further described herein (e.g., in connection with FIG. 5).

Further, table manager 338-1 can organize the subsets of data (e.g., the table entries for each respective subset) in a number of first in, first out (FIFO) buffers in the first type of memory, with each respective buffer corresponding to different hotness data. The buffer(s) can be, for instance, a circular buffer(s). The position of a subset of data in a particular buffer, and/or whether the subset of data is in the buffer, can correspond to the frequency at which the address corresponding to that subset of data has been accessed during program operations, which can correspond to the age of the data linked to that address. For example, the oldest subset(s) of data in a particular buffer, and/or subset(s) of data that have been removed from that buffer (e.g., and replaced in the buffer with another subset(s)), can be the subset(s) of data that have been accessed least frequently for the hotness data corresponding to that buffer. Such buffers will be further described herein (e.g., in connection with FIG. 5).

Read manager 338-2 can execute sense (e.g., read) commands by locating data in the memory arrays and causing the transfer of data associated with the sense commands to the host. For example, in response to receiving a sense (e.g., read) command from the host, read manager 338-2 can initiate a sense operation to sense the data associated with the command. Read manager 338-2 can determine, using the residency data stored in the table managed by table manager 338-1, whether the data to be sensed during the sense operation is stored in the first type of memory (e.g., array 210) or the second type of memory (e.g., arrays 212-1, . . . , 212-N), and can then sense the data from the appropriate location and transfer the sensed data to the host. The sensed data may comprise a portion, or all, of one or more of the number of subsets of data stored in the memory arrays.

Load manager 338-3 can identify, upon sense operations being performed by read manager 338-2 on the second type of memory (e.g., if the sensed data is stored in arrays 212-1, . . . , 212-N), a subset or subsets (e.g., LMU(s)) of data stored in the second type of memory to relocate to the first type of memory (e.g., array 210) based, at least in part, on the amount of data sensed during the sense operations and/or the frequency at which the address(es) corresponding to the subset(s) of data stored in the second type of memory have been accessed during sense operations performed by read manager 338-2. For example, if the data sensed during a sense operation performed by read manager 338-2 is stored in the second type of memory, and if the amount of data stored in the first type of memory does not meet or exceed a predefined threshold, load manager 338-2 can determine whether the amount of data sensed during the sense operation meets or exceeds a particular threshold and/or whether the frequency at which the data has been sensed meets or exceeds a particular threshold. If the amount of sensed data does not meet or exceed that particular threshold, and/or if the frequency at which the data has been sensed meets or exceeds that particular threshold, load manager 338-2 can identify the subset(s) of data that include(s) the sensed data as the subset(s) to relocate to the first type of memory.

Upon identifying the subset(s) of data to relocate to the first type of memory, load manager 338-3 can proceed with the relocation (e.g., migration). For example, load manager 338-3 can instruct write manager 338-4 to perform a program operation to program the data sensed during the sense operation performed by read manager 338-2 to the first type of memory, and can instruct table manager 338-1 to update the location (e.g., residency) data for the identified subset(s) in the table with the location in the first type of memory to which the sensed data is programmed. Further, if there is not a backup copy of the sensed data stored in the second type of memory, load manager 338-3 can invalidate the original version of the data stored in the second type of memory. However, if there is a backup copy, no such invalidation may occur.

In a number of embodiments, the identified subset(s) may be part of a sequential group (e.g., cluster) of subsets of data stored in the first type of memory. In such embodiments, the entire group of subsets (e.g., all the subsets of data in the group, not just the identified subset(s)) may be relocated to the second type of memory. The size of the group of subsets can be, for example, equal to the size of a page of data stored in the first type of memory.

Write manager 338-4 can execute program (e.g., write) commands by routing data associated with the program commands to the first type of memory (e.g., array 210) and/or the second type of memory (e.g., arrays 212-1, . . . , 212-N). For example, in response to receiving a program command from the host, write manager 338-4 can initiate a program operation to program the data associated with the command.

Write manager 338-4 can determine whether to program the data to the first type of memory, the second type of memory, or both based on a number of criteria. The number of criteria can include the size of the data that is being programmed, the amount of available space in the memory arrays, and/or the frequency that data is being written to the memory arrays, among other criteria. For example, if the amount of data stored in the first type of memory meets or exceeds a predefined threshold, write manager 338-4 may program the data to the second type of memory. Further, if the amount of data stored in the first type of memory does not met or exceed the predefined threshold, but the amount of data to be programmed meets or exceeds a predefined threshold, write manager 338-4 may also program the data to the second type of memory. However, if the amount of data stored in the first type of memory does not met or exceed that predefined threshold, and if the amount of data to be programmed does not meet or exceed that predefined threshold, write manager 338-4 may program the data to the first type of memory.

Flush manager 338-5 can identify, upon the amount of data stored in the first type of memory (e.g., array 210) meeting or exceeding that predefined threshold, a subset or subsets (e.g., LMU(s)) of data stored in the first type of memory to relocate to the second type of memory (e.g., arrays 212-1, . . . , 212-N) based, at least in part, on the frequency at which the address(es) corresponding to the subset(s) of data stored in the first type of memory have been accessed during program operations performed by write manager 338-4. For example, flush manager 338-5 can perform this identification immediately upon the predefined threshold being met, or when the next power cycle occurs after the predefined threshold has been met.

As an example, flush manager 338-5 can identify the subset(s) of data from among the number of subsets of data stored in the first type of memory that have been accessed least frequently during program operations performed by write manager 338-4 as the subset(s) to relocate to the second type of memory. Flush manager 338-5 can identify the least frequently accessed subset(s) using the frequency (e.g., hotness) data stored in the table managed by table manager 338-1. Further, flush manager 338-5 can identify the least frequently accessed subset(s) based on which subsets are in the buffers managed by table manager 338-1, and/or based on the positions of the subsets in the buffers. For example, flush manager 338-5 can identify the subset(s) that have been removed from the buffers as the least frequently accessed subset(s). As an additional example, flush manager 338-5 can identify the least frequently accessed subset(s) based on the positions of the table entries for each respective subset in buffer. The identification of the least frequently accessed subset(s) will be further described herein (e.g., in connection with FIG. 5).

Upon identifying the subset(s) of data to relocate to the second type of memory, flush manager 338-5 can proceed with the relocation (e.g., migration). For example, if the frequency data for the identified subset(s) indicates that the address(es) corresponding to that subset(s) has been accessed during a (e.g., one) program operation, flush manager 338-5 can instruct read manager 338-2 to perform a sense operation to sense the data stored in the identified subset(s), instruct write manager 338-4 to perform a program operation to program this sensed data to the second type of memory, instruct table manager 338-1 to update the location (e.g., residency) data for the identified subsets in the table with the location in the second type of memory to which the sensed data was programmed, and invalidate the data stored in the identified subset(s) in the first type of memory. If the frequency data for the identified subset(s) indicates that the address(es) corresponding to that subset(s) has not been accessed during any program operations, and if a backup copy of the data stored in the identified subset(s) exists, flush manager 338-5 can retrieve the location in the second type of memory where the backup copy of the data is stored, instruct table manager 338-1 to update the location (e.g., residency) data for the identified subsets in the table with this retrieved location, and invalidate the data stored in the identified subset(s) in the first type of memory. If a backup copy of the data stored in the identified subset(s) does not exist, flush manager 338-5 can relocate the identified subset(s) in a manner analogous to that described in connection with the frequency data for the identified subset(s) indicating that the address(es) corresponding to that subset(s) has been accessed during a program operation.

Clean manager 338-6 can reset invalidated subsets of data (e.g., invalidated LMUs) to a predefined value, and update the status of the reset LMUs accordingly (e.g., change the status from invalid to free). For instance, if data previously written in the first type of memory is updated by the host, and table manager 338-1 implements an out-of-place update strategy, the updated data can be written in a new physical location in the first type of memory, and the previous data can be invalidated. The invalidated data can subsequently be cleaned by clean manager 338-6.

Figure 4:
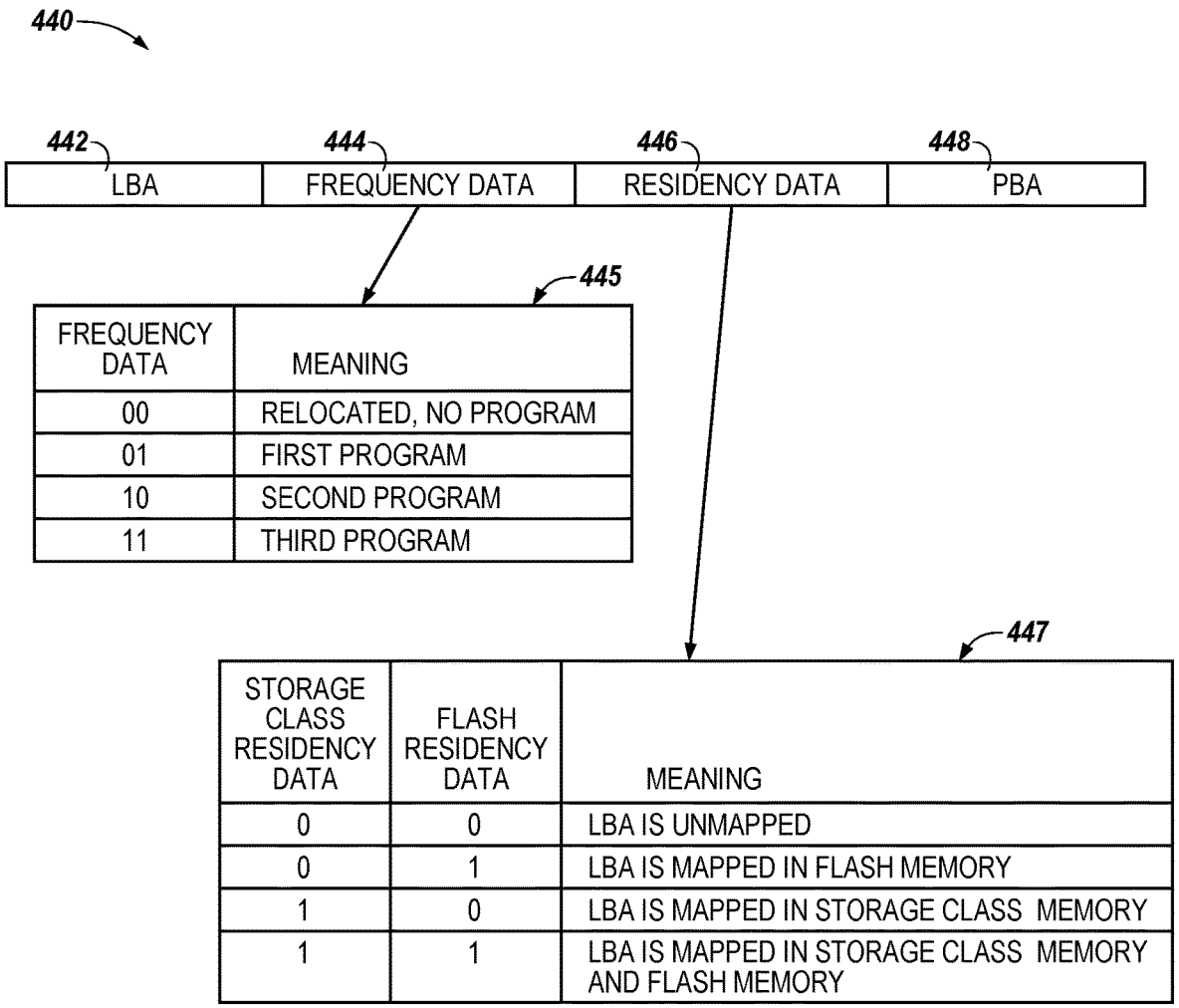
FIG. 4 illustrates an example of an entry in a table stored in memory and managed by a table manager in accordance with a number of embodiments of the present disclosure.

FIG. 4 illustrates an example of an entry 440 in a table stored in memory and managed by a table manager in accordance with a number of embodiments of the present disclosure. For example, entry 440 can be an entry (e.g., an SMU) in a table stored in a first type of memory (e.g., array 210 previously described in connection with FIG. 2, which can be, for instance, SCM) and managed by table manager module 338-1 previously described in connection with FIG. 3. Further, entry 440 can correspond to a subset of data (e.g., LMU) stored in the first type of memory and/or a second type of memory (e.g., arrays 212-1, . . . , 212-N previously described in connection with FIG. 2, which can be, for instance NAND flash memory).

As shown in FIG. 4, entry 440 can include a logical block address (LBA) 442, frequency (e.g., hotness) data 444, residency data 446, and a physical block address (PBA) 448. Residency data 446 can indicate whether the subset of data is stored in the first type of memory (e.g., the SCM), the second type of memory (e.g., the flash memory), or both, and LBA 442 and PBA 448 can be used to locate the subset of data in the array(s) in which it is stored.

Table 447 shown in FIG. 4 illustrates examples of different possible residency data (e.g., bits) that can be included in entry 440. In the example illustrated in table 447, residency data 446 can include a first bit (e.g., a storage class residency bit) that can indicate whether the subset of data is stored in the SCM, and a second bit (e.g., a flash residency bit) that can indicate whether the subset of data is stored in the flash memory. For instance, as illustrated in table 447, a storage class residency bit of 0 and a flash residency bit of 1 indicates the subset of data is stored (e.g., LBA 442 is mapped to PBA 448 to locate the data) in the flash memory, a storage class residency bit of 1 and a flash residency bit of 0 indicates the subset of data is stored (e.g., LBA 442 is mapped to PBA 448 to locate the data) in the SCM and, a storage class residency bit of 1 and a flash residency bit of 1 indicates the subset of data is stored (e.g., LBA 442 is mapped to PBA 448 to locate the data) in both the SCM and the flash memory. The storage class residency bit and the flash residency bit can both default to 0 for an unmapped LBA.

Frequency (e.g., hotness) data 444 can indicate the frequency at which the address corresponding to (e.g., the LBA identifying) the subset of data has been accessed during program operations. Table 445 shown in FIG. 4 illustrates examples of different possible frequency data (e.g., bits) that can be included in entry 440. In the example illustrated in table 445, frequency data 444 can include two bits that can be used to indicate four possible frequencies at which the address corresponding to the subset of data may have been accessed. For instance, as illustrated in table 445, frequency bits of 00 indicates the subset of data has been relocated from the flash memory to the SCM, but has not yet been accessed during any program operation(s) subsequent to being relocated. Frequency bits of 01 indicates the subset of data has been accessed once during program operations, which may have occurred either during a direct write of the data to the SCM, or during the first write performed on the subset after it has been relocated from the flash memory. Frequency bits of 10 indicates the subset of data has been accessed twice during program operations, and frequency bits of 11 indicates the subset of data has been accessed three or more times during program operations.

Figure 5:
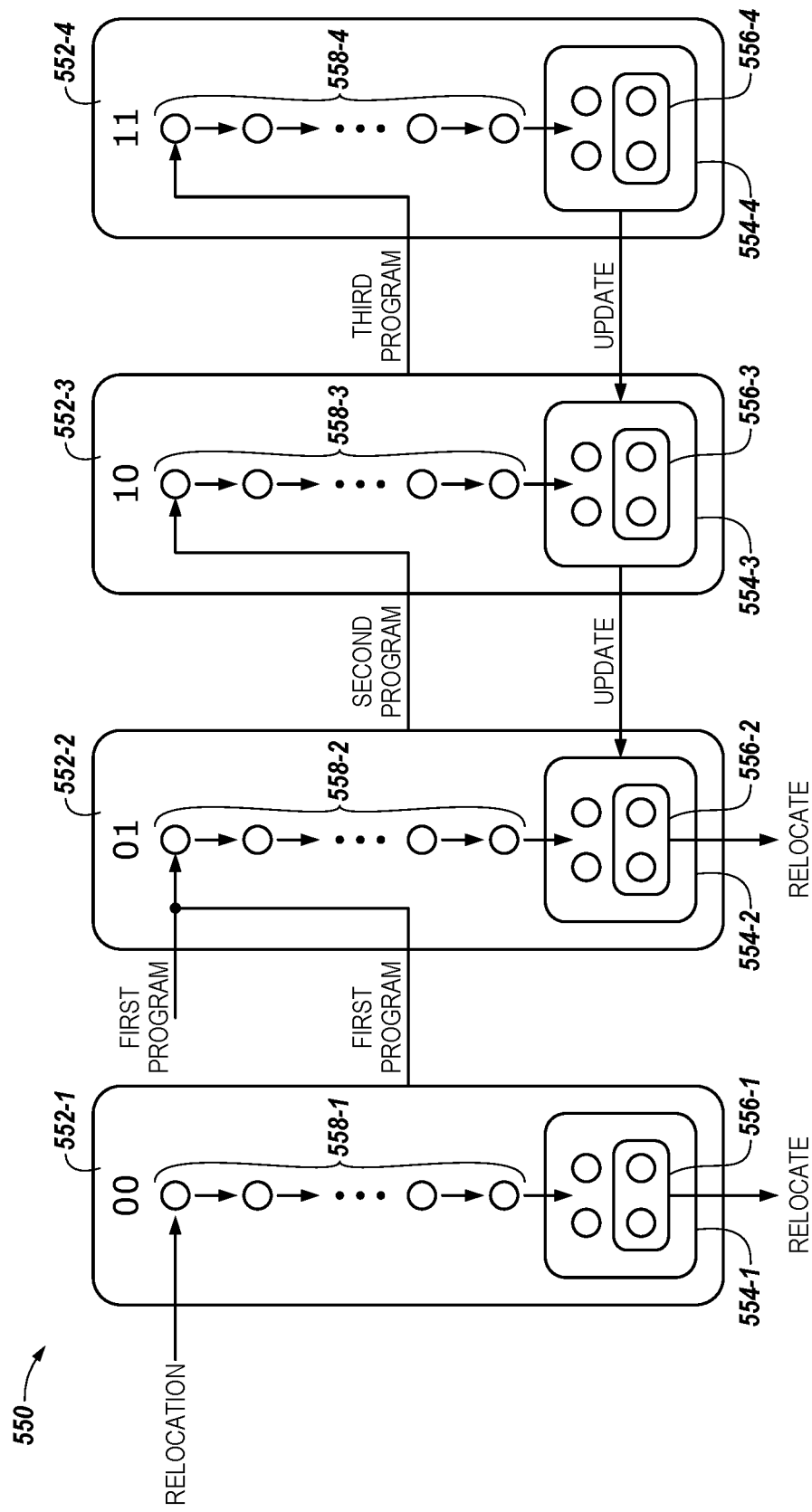
FIG. 5 illustrates a conceptual example of a process for identifying data to relocate in memory in accordance with a number of embodiments of the present disclosure.

FIG. 5 illustrates a conceptual example 550 of a process for identifying data to relocate in memory in accordance with a number of embodiments of the present disclosure. For instance, FIG. 5 illustrates an example process for identifying subsets of data (e.g., LMUs) stored in a first type of memory to relocate to a second type of memory. The first type of memory can be, for instance, array 210 previously described in connection with FIG. 2 (e.g., SCM), the second type of memory can be, for instance, arrays 212-1, . . . , 212-N described in connection with FIG. 2 (e.g., NAND flash memory), and the process can be performed by, for instance, controllers 208 and/or 308 previously described in connection with FIGS. 2 and 3, respectively. The subsets of data are represented by the circles illustrated in FIG. 5. For instance, each circle illustrated in FIG. 5 represents a different subset of data stored in the first type of memory.

As previously described herein, each of the subsets of data can have frequency (e.g., hotness) data associated therewith stored in a table in the first type of memory that indicates the frequency at which the address corresponding to that respective subset of data has been accessed during program operations performed on the memory. In the example illustrated in FIG. 5, each of the subsets of data are associated with one of four possible frequency values (e.g., 00, 01, 10, or 11), which are analogous to the frequency data (e.g., bits) previously described in connection with FIG. 4 (e.g., the subsets of data associated with bits 00 have been relocated from the flash memory to the SCM, but have not yet been accessed during any program operation(s) subsequent to being relocated, the subsets of data associated with bits 01 have been accessed once during program operations, the subsets of data associated with bits 10 have been accessed twice during program operations, and the subsets of data associated with bits 11 have been accessed three or more times during program operations). Set 552-1 comprises the subsets of data associated with bits 00, set 552-2 comprises the subsets of data associated with bits 01, set 552-3 comprises the subsets of data associated with bits 10, and set 552-4 comprises the subsets of data associated with bits 11.

As previously described herein, the subsets of data 552 can be organized (e.g., by table manager 338-1 previously described in connection with FIG. 3) at least in part in FIFO buffers 558 in the first type of memory. In the example illustrated in FIG. 5, the first type of memory includes four FIFO buffers (e.g., 558-1, 558-2, 558-3, and 558-4), with subsets of data associated with frequency bits 00 (e.g., subsets of data in set 552-1) organized in buffer 558-1, subsets of data associated with frequency bits 01 (e.g., subsets of data in set 552-2) organized in buffer 558-2, subsets of data associated with frequency bits 10 (e.g., subsets of data in set 552-3) organized in buffer 558-3, and subsets of data associated with frequency bits 11 (e.g., subsets of data in set 552-4) organized in buffer 558-4.

The subsets of data can be organized in each respective buffer 558-1, 558-2, 558-3, and 558-4 according to how recently they have been accessed during a program operation. As such, the position of a subset in a respective buffer 558-1, 558-2, 558-3, and 558-4 can provide a further indication of the frequency at which the address corresponding to that subset has been accessed during program operations. Further, each respective buffer 558 can be smaller than the respective subsets of data 552, such that only the more recently accessed data is organized according to how recently it has been accessed.

For example, when a subset of data is relocated from the flash memory to the SCM, the subset can be placed in the first (e.g., newest) position in buffer 558-1, as illustrated in FIG. 5. When another subset of data is relocated from the flash memory to the SCM, that subset can be placed in the first position in buffer 558-1, and the first subset can be moved to the next position in buffer 558-1, as illustrated in FIG. 5. This process can continue as additional subsets of data are relocated from the flash memory to the SCM, until buffer 558-1 is full (e.g., until a subset of data has been moved to the last position in buffer 558-1). As such, the older the position of a subset in buffer 558-1, the less frequently that subset has been accessed. For instance, the subset of data in the last (e.g., oldest) position in buffer 558-1 has been accessed least frequently among the subsets of data in buffer 558-1.

When a subset of data is relocated from the flash memory to the SCM while buffer 558-1 is full, space can be made in buffer 558-1 for that subset of data by removing the subset of data that is in the last position (e.g., the oldest subset of data) from buffer 558-1, and moving each other respective subset in buffer 558-1 to its respective next position in buffer 558-1, as illustrated in FIG. 5. The newly relocated subset of data can then be placed in the first (e.g., newest) position in buffer 558-1. This process can be implemented, for example, using a circular buffer (e.g., buffer 558-1 can be a circular buffer). Subset 554-1 of set 552-1 comprises the subsets of data that have been removed from buffer 558-1 in set 552-1, as illustrated in FIG. 5.

As such, whether a subset of data has been removed from buffer 558-1 can provide a further indication of the frequency at which the address corresponding to that subset has been accessed during program operations. For instance, whether a subset of data has been removed from buffer 558-1 can provide an indication of the age of the data, thereby distinguishing between recently written and older data. For example, subsets of data that have been removed from buffer 558-1 (e.g., the subsets of data in subset 554-1) are the subsets of data that have been accessed least frequently among the subsets of data associated with frequency bits 00 (e.g., the subsets of data in set 552-1). As such, one or more of the subsets that have been removed from buffer 558-1 can be identified as the subset(s) of data to relocate from the first type of memory (e.g., the SCM) to the second type of memory (e.g., the flash memory).

For example, a group (e.g., cluster) of subsets that have been removed from buffer 558-1 can be identified as the subsets of data to relocate from the SCM to the flash memory. For instance, in the example illustrated in FIG. 5, group 556-1 of the subsets of data in subset 554-1 have been identified as the subsets to relocate. Such a group can be a sequential group of subsets from buffer 558-1, whose size is equal to the size of a page of data stored in the flash memory.

As shown in FIG. 5, upon the first program operation access occurring for a subset of data in set 552-1, the frequency bits for the subset of data can be updated (e.g., incremented) from 00 to 01, and the subset of data can be moved from set 552-1 to set 552-2. For instance, the subset of data can be placed in the first (e.g., newest) position in buffer 558-2 in set 552-2, as illustrated in FIG. 5. Further, a subset of data whose first program operation access occurs as part of a direct write to the SCM can be placed in the first position in buffer 558-2 in set 552-2, as illustrated in FIG. 5.

When another subset of data undergoes its first program operation, that subset can be placed in the first position in buffer 558-2, and the first subset can be moved to the next position in buffer 558-2, as illustrated in FIG. 5. This process can continue as additional subsets of data undergo their respective first program operations, until buffer 558-2 is full. As such, the older the position of a subset in buffer 558-2, the less frequently that subset has been accessed, in a manner analogous to that described for buffer 558-1.

When a subset of data undergoes its first program operation while buffer 558-2 is full, space can be made in buffer 558-2 for that subset by removing the subset of data that is in the last position (e.g., the oldest subset of data) from buffer 558-2, and moving each other respective subset in buffer 558-2 to its respective next position in buffer 558-2, as illustrated in FIG. 5. The newly programmed subset of data can then be placed in the first position in buffer 558-2. Subset 554-2 of set 552-2 comprises the subsets of data that have been removed from buffer 558-2 in set 552-2, as illustrated in FIG. 5.

As such, whether a subset of data has been removed from buffer 558-2 can provide a further indication of the frequency at which the address corresponding to that subset has been accessed during program operations. For example, subsets of data that have been removed from buffer 558-2 (e.g., the subsets of data in subset 554-2) are the subsets of data that have been accessed least frequently among the subsets of data associated with frequency bits 01 (e.g., the subsets of data in set 552-2). As such, one or more of the subsets that have been removed from buffer 558-2 can be identified as the subset(s) of data to relocate from the first type of memory (e.g., the SCM) to the second type of memory (e.g., the flash memory).

For example, a group (e.g., cluster) of subsets that have been removed from buffer 558-2 can be identified as the subsets of data to relocate from the SCM to the flash memory. For instance, in the example illustrated in FIG. 5, group 556-2 of the subsets of data in subset 554-2 have been identified as the subsets to relocate (e.g., along with the subsets of data in subset 554-1). Such a group can be a sequential group of subsets from buffer 558-2, whose size is equal to the size of a page of data stored in the flash memory.

As shown in FIG. 5, upon the second program operation access occurring for a subset of data in set 552-2, the frequency bits for the subset of data can be updated (e.g., incremented) from 01 to 10, and the subset of data can be moved from set 552-2 to set 552-3. For instance, the subset of data can be placed in the first position in buffer 558-3 in set 552-3, as illustrated in FIG. 5. When another subset of data undergoes its second program operation, that subset can be placed in the first position in buffer 558-3, and the first subset can be moved to the next position in buffer 558-3, and this process can continue as additional subsets of data undergo their respective second program operations until buffer 558-3 is full, in a manner analogous to that described for buffers 558-1 and 558-2.

When a subset of data undergoes its second program operation while buffer 558-3 is full, space can be made in buffer 558-3 for that subset by removing the subset of data that is in the last position from buffer 558-3, and moving each other respective subset in buffer 558-3 to its respective next position in buffer 558-3, as illustrated in FIG. 5. The newly programmed subset of data can then be placed in the first position in buffer 558-3. Subset 554-3 of set 552-3 comprises the subsets of data that have been removed from buffer 558-3 in set 552-3, and can include a group (e.g., cluster) of subsets 556-3, as illustrated in FIG. 5.

As shown in FIG. 5, the frequency bits for the subsets of data that have been removed from buffer 558-3 (e.g., the subsets of data in subset 554-3) can be periodically updated (e.g., decremented) from 10 to 01, and these subsets of data can be moved from set 552-3 to set 552-2. For instance, these subsets of data can be placed in subset 554-2 of set 552-2, as illustrated in FIG. 5. The periodic update can occur, for example, upon a predefined number of program operations being performed on the memory, and/or can occur in a round-robin scheduling order on the subsets of data.

As shown in FIG. 5, upon the third program operation access occurring for a subset of data in set 552-3, the frequency bits for the subset of data can be updated (e.g., incremented) from 10 to 11, and the subset of data can be moved from set 552-3 to set 552-4. For instance, the subset of data can be placed in the first position in buffer 558-4 in set 552-4, as illustrated in FIG. 5. When another subset of data undergoes its third program operation, that subset can be placed in the first position in buffer 558-4, and the first subset can be moved to the next position in buffer 558-4, and this process can continue as additional subsets of data undergo their respective third program operations until buffer 558-4 is full, in a manner analogous to that described for buffers 558-1 and 558-2, and 558-3.

When a subset of data undergoes its third program operation while buffer 558-4 is full, space can be made in buffer 558-4 for that subset by removing the subset of data that is in the last position from buffer 558-4, and moving each other respective subset in buffer 558-4 to its respective next position in buffer 558-4, as illustrated in FIG. 5. The newly programmed subset of data can then be placed in the first position in buffer 558-4. Subset 554-4 of set 552-4 comprises the subsets of data that have been removed from buffer 558-4 in set 552-4, and can include a group (e.g., cluster) of subsets 556-4, as illustrated in FIG. 5.

As shown in FIG. 5, the frequency bits for the subsets of data that have been removed from buffer 558-4 (e.g., the subsets of data in subset 554-4) can be periodically updated (e.g., decremented) from 11 to 10, and these subsets of data can be moved from set 552-4 to set 552-3. For instance, these subsets of data can be placed in subset 554-3 of set 552-3, as illustrated in FIG. 5. The periodic update can occur, for example, at the same time as the periodic update described in connection with set 552-3 (e.g., both can occur as part of the same periodic update). However, it is noted that, in the example illustrated in FIG. 5, this periodic update does not include updating the frequency bits for the subsets of data that have been removed from buffers 558-2 or 558-1 (e.g., the subsets of data in subsets 554-2 or 554-1). That is, the frequency bits for the subsets of data that have been removed from buffers 558-2 and 558-1 are not decremented as part of the periodic update.

Figures 6A, 6B:
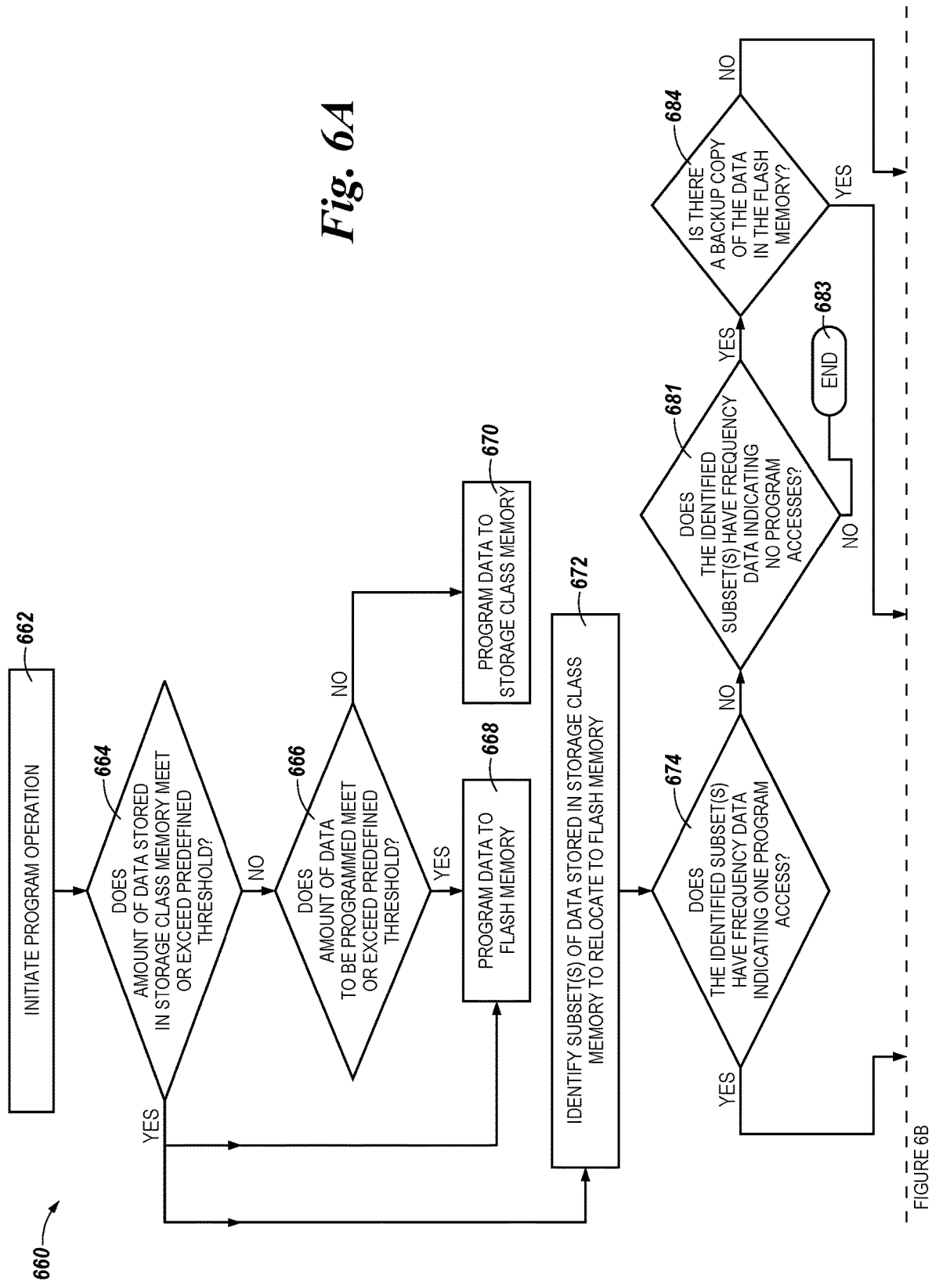
FIGS. 6A-6B illustrate a method for operating memory in accordance with a number of embodiments of the present disclosure.
Figure 6B:
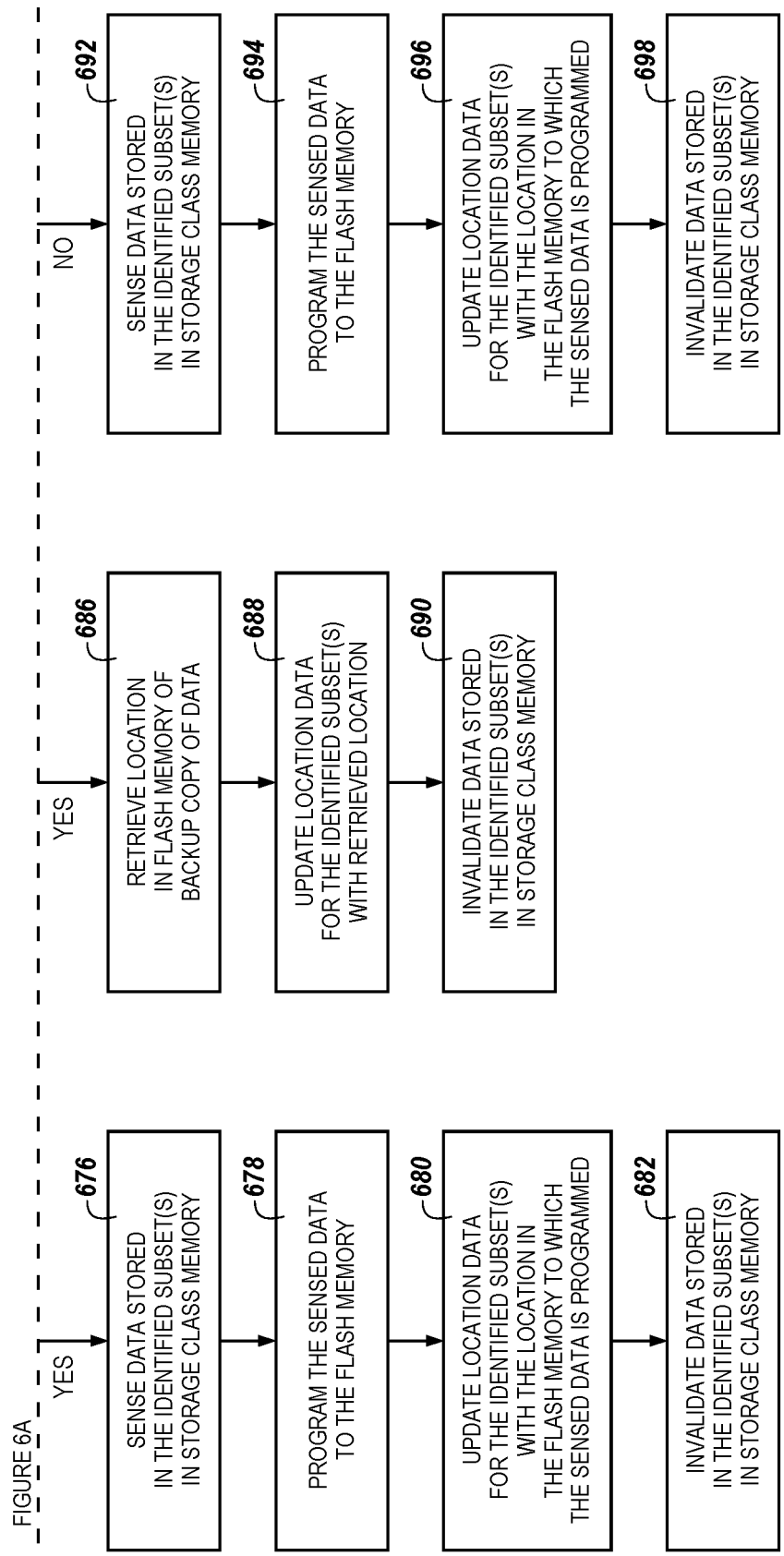

FIGS. 6A-6B illustrate a method 660 for operating memory, such as, for instance, memories 210 (e.g., SCM) and 212-1, . . . , 212-N (e.g., flash memory) previously described in connection with FIG. 2, in accordance with a number of embodiments of the present disclosure. Method 660 can be performed by, for example, controller 206 and/or 306 previously described in connection with FIGS. 2 and 3, respectively.

At block 662, method 660 includes initiating a program operation to program data to the memory, and at block 664 method 660 includes determining whether the amount of data stored in the SCM meets or exceeds a predefined threshold, such as, for instance, whether the SCM is full or close to full (e.g., a threshold that is not meet or exceeded frequently during operation of the memory).

If it is determined that the amount of data stored in the SCM does not meet or exceed this predefined threshold, it is determined at block 666 whether the amount of data to be programmed during the program operation meets or exceeds a predefined threshold, such as, for instance, 4 KB, 128 KB, or 512 KB. If it is determined that the amount of data to be programmed meets or exceeds this predefined threshold, the data can be programmed to the flash memory at block 668. If, however, it is determined that the amount of data to be programmed does not meet or exceed this predefined threshold, the data can be programmed to the SCM at block 670. A predefined threshold of 4 KB can ensure only small amounts of data will be programmed to the SCM, a predefined threshold of 128 KB can ensure data involved in random write access will be programmed to the SCM, and a predefined threshold of 512 KB can ensure all data is programmed to the SCM.

If it is determined at block 664 that the amount of data stored in the SCM meets or exceeds the predefined threshold, the data to be programmed during the program operation is programmed to the flash memory at block 668, and method 660 also proceeds to block 672. At block 672, method 660 includes identifying a subset or subsets of data (e.g., LMU(s)) stored in the SCM to relocate (e.g., migrate) to the flash memory. The subset(s) can be identified based, at least in part, on the frequency with which the address(es) (e.g., LBA(s)) corresponding to the subset(s) of data stored in the SCM have been accessed during previous program operations performed on the memory, as previously described herein. For instance, the identified subset(s) can include subsets that have not been accessed and/or have been accessed once, as previously described herein.

At block 674, method 660 includes determining whether the identified subset(s) have frequency data associated therewith indicating the identified subset(s) have been accessed once during previous program operations (e.g., frequency data 01 previously described in connection with FIGS. 4 and 5). If it is determined the identified subset(s) have frequency data associated therewith indicating they have been accessed once during previous program operations, the data stored in the identified subset(s) can be sensed at block 676, this sensed data can be programmed to the flash memory at block 678, location (e.g., residency) data for the identified subset(s) stored in a table in the SCM (as previously described herein) can be updated with the location in the flash memory to which the sensed data is programmed at block 680, and the data stored in the identified subset(s) in the SCM can be invalidated at block 682. If it is determined the identified subset(s) do not have frequency data associated therewith indicating the identified subset(s) have been accessed once during previous program operations, method 660 proceeds to block 681.

At block 681, method 660 includes determining whether the identified subset(s) have frequency data associated therewith indicating the identified subset(s) have not been accessed during previous program operations (e.g., frequency data 00 previously described in connection with FIGS. 4 and 5). If it is determined the identified subset(s) do not have frequency data associated therewith indicating they have not been accessed during previous program operations, method 660 ends at block 683. If it is determined the identified subset(s) have frequency data associated therewith indicating they have not been accessed during previous program operations, method 660 proceeds to block 684.

At block 684, method 660 includes determining whether there is a backup copy of the data in the identified subset(s) stored in the flash memory. If there is a backup copy of the data stored in the flash memory, a location of where the backup copy of the data is stored in the flash memory can be retrieved at block 686, the location data for the identified subset(s) can be updated with the retrieved location at block 688, and the data stored in the identified subset(s) in the SCM can be invalidated at block 690. If there is not a backup copy of the data stored in the flash memory, the data stored in the identified subset(s) can be sensed at block 692, this sensed data can be programmed to the flash memory at block 694, location (e.g., residency) data for the identified subset(s) stored in a table in the SCM (as previously described herein) can be updated with the location in the flash memory to which the sensed data is programmed at block 696, and the data stored in the identified subset(s) in the SCM can be invalidated at block 698.

Figure 7:
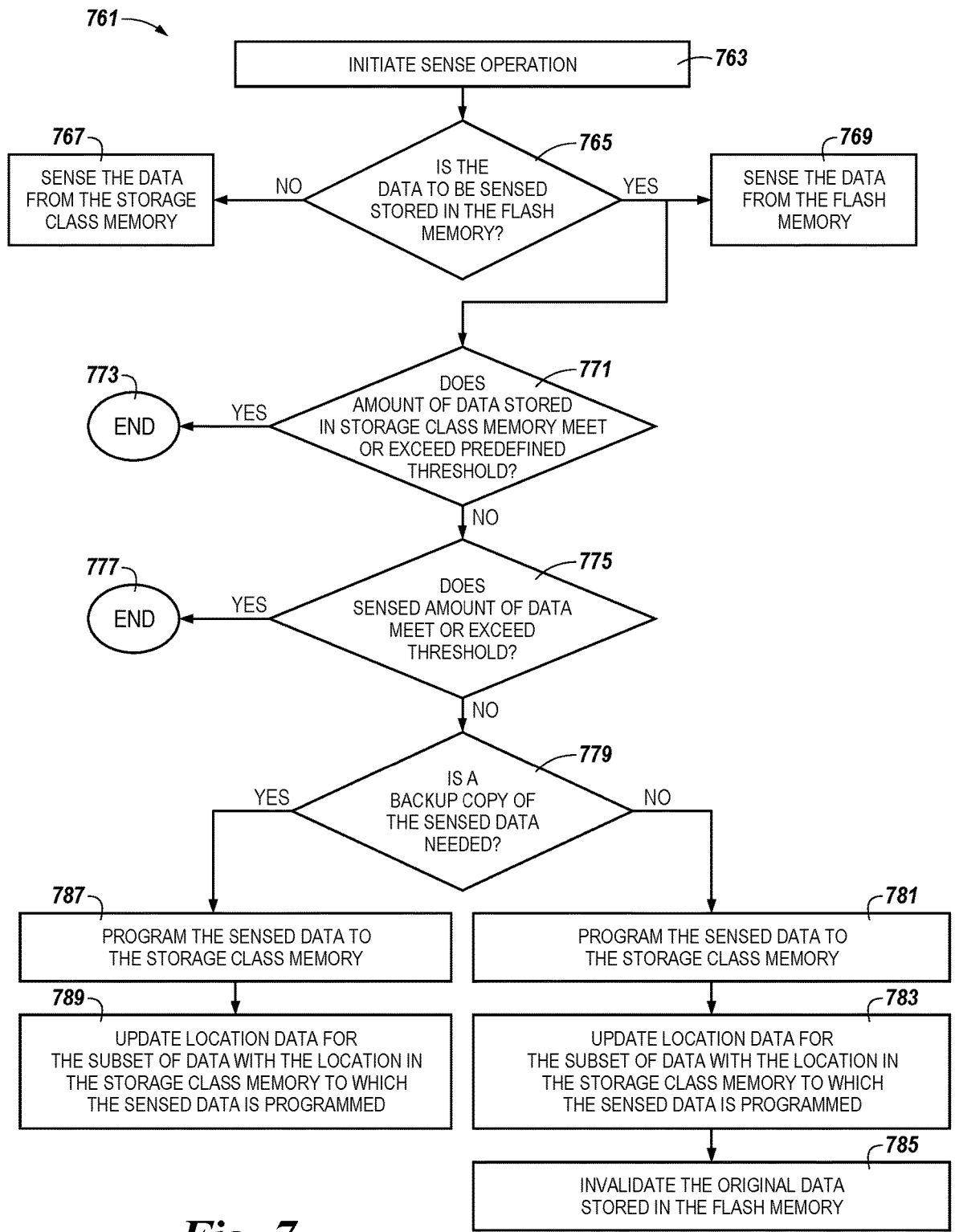
FIG. 7 illustrates a method for operating memory in accordance with a number of embodiments of the present disclosure.

FIG. 7 illustrates a method 761 for operating memory, such as, for instance, memories 210 (e.g., SCM) and 212-1, ..., 212-N (e.g., flash memory) previously described in connection with FIG. 2, in accordance with a number of embodiments of the present disclosure. Method 761 can be performed by, for example, controller 206 and/or 306 previously described in connection with FIGS. 2 and 3, respectively.

At block 763, method 761 includes initiating a sense operation to sense data stored in the memory, and at block 765 method 761 includes determining whether the data to be sensed during the sense operation is stored in the flash memory. This determination can be made, for example, using location (e.g., residency) data stored in a table in the SCM, as previously described herein. If it is determined the data to be sensed is not stored in the flash memory, the data can be sensed from the SCM at block 767. If it is determined the data to be sensed is stored in the flash memory, the data can be sensed from the flash memory at block 769, and method 761 also proceeds to block 771.

At block 771, method 761 includes determining whether the amount of data stored in the SCM meets or exceeds a predefined threshold. This threshold can be, for example, the same threshold used at block 664 of FIG. 6A. If it is determined the amount of data stored in the SCM meets or exceeds the predefined threshold, method 761 ends at block 773. If it is determined the amount of data stored in the SCM does not meet or exceed the predefined threshold, method 761 proceeds to block 775.

At block 775, method 761 includes determining whether the amount of data sensed from the flash memory during the sense operation meets or exceeds a particular threshold, such as, for instance, 4 KB or 512 KB. A threshold of 4 KB can ensure only small amounts of sensed data will be relocated to the SCM, while a threshold of 512 KB can ensure all sensed data will be relocated to the SCM. If it is determined the amount of data sensed during the sense operation meets or exceeds the particular threshold, method 761 ends at block 777. If it is determined the amount of data sensed during the sense operation does not meet or exceed the particular threshold, method 761 proceeds to block 779.

At block 779, method 761 includes determining whether a backup copy of the data sensed during the sense operation needed. This determination can be, for example, a check on a configuration bit. If it is determined a backup copy of the sensed data is not needed, the sensed data is programmed to the SCM at block 781, the location data for the subset of data can be updated with the location in the SCM to which the sensed data is programmed at block 783, and the original data stored in the flash memory can be invalidated at block 785. If it is determined a backup copy of the sensed data is needed, the sensed data is programmed to the SCM at block 787, and the location data for the subset of data can be updated with the location in the SCM to which the sensed data is programmed at block 789.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory, wherein the memory includes a first type of memory and a second type of memory; and
   a controller configured to:
   identify a subset of data stored in the first type of memory to relocate to the second type of memory upon determining an address corresponding to the subset of data stored in the first type of memory has been accessed least frequently during program operations performed on the memory;
set a threshold amount of data for determining whether to relocate data stored in the second type of memory to the first type of memory;
identify a subset of data stored in the second type of memory to relocate to the first type of memory upon determining an amount of data sensed during a sense operation performed on the subset of data stored in the second type of memory does not meet the threshold amount of data; and
initiate a relocation of the identified subset of data stored in the second type of memory from the second type of memory to the first type of memory upon determining the amount of data sensed during the sense operation does not meet the threshold amount of data.

2. The apparatus of claim 1, wherein the controller is configured to identify the subset of data stored in the first type of memory to relocate to the second type of memory based, at least in part, on a position of the subset of data in a first in, first out (FIFO) buffer in the first type of memory.

3. The apparatus of claim 1, wherein the controller is configured to identify the subset of data stored in the first type of memory to relocate to the second type of memory based, at least in part, on whether the subset of data is in a first in, first out (FIFO) buffer in the first type of memory.

4. The apparatus of claim 1, wherein data indicating the frequency at which the address corresponding to the subset of data stored in the first type of memory has been accessed during program operations performed on the memory is included in the first type of memory.

5. The apparatus of claim 4, wherein the controller is configured to periodically update the data indicating the frequency at which the address corresponding to the subset of data stored in the first type of memory has been accessed during program operations performed on the memory.

6. The apparatus of claim 4, wherein the controller is configured to update the data indicating the frequency at which the address corresponding to the subset of data stored in the first type of memory has been accessed during program operations performed on the memory upon the subset of data being accessed during a program operation performed on the memory.

7. An apparatus, comprising:
a memory, wherein the memory includes a first type of memory and a second type of memory; and
a controller configured to:
set a threshold amount of data for determining whether to relocate data stored in the first type of memory to the second type of memory;
identify a subset of data stored in the first type of memory to relocate to the second type of memory upon determining an amount of data sensed during a sense operation performed on the subset of data stored in the first type of memory does not meet the threshold amount of data;
initiate a relocation of the identified subset of data stored in the first type of memory from the first type of memory to the second type of memory upon determining the amount of data sensed during the sense operation does not meet the threshold amount of data; and
identify a subset of data stored in the second type of memory to relocate to the first type of memory upon determining an address corresponding to the subset of data stored in the first type of memory has been accessed least frequently during program operations performed on the memory.

8. The apparatus of claim 7, wherein the second type of memory is 3D XPoint memory.

9. The apparatus of claim 7, wherein the second type of memory is resistance variable memory.

10. The apparatus of claim 7, wherein the controller is configured to identify the subset of data stored in the first type of memory to relocate to the second type of memory upon the sense operation being performed on the subset of data stored in the first type of memory.

11. A method for operating memory, comprising:
identifying a first subset of data among a number of subsets of data to relocate to a second type of memory upon determining that the first subset of data has been accessed least frequently during program operations performed on the memory, wherein the number of subsets of data are stored in a first type of memory;
setting a threshold amount of data for determining whether to relocate data stored in the second type of memory to the first type of memory;
identifying a second subset of data among a number of subsets of data stored in the second type of memory to relocate to the first type of memory upon determining an amount of data sensed during a sense operation performed on the second subset of data stored in the second type of memory does not meet or exceed the threshold amount of data;
relocating the first identified subset of data from the first type of memory to the second type of memory; and
relocating the second identified subset of data from the second type of memory to the first type of memory upon determining the amount of data sensed during the sense operation does not meet or exceed the threshold amount of data.

12. The method of claim 11, wherein the first subset of data that has been accessed least frequently during program operations performed on the memory is an oldest subset of data in a first in, first out (FIFO) buffer in the first type of memory.

13. The method of claim 11, wherein the first subset of data that has been accessed least frequently during program operations performed on the memory is a subset of data that has been removed from a first in, first out (FIFO) buffer in the first type of memory.

14. The method of claim 11, wherein:
the first type of memory includes a number of first in, first out (FIFO) buffers, wherein:
a first one of the number of FIFO buffers includes subsets of data stored in the first type of memory that have been relocated from the second type of memory to the first type of memory and have not been accessed during program operations performed on the memory subsequent to being relocated;
a second one of the number of FIFO buffers includes subsets of data stored in the first type of memory that have been accessed once during program operations performed on the memory;
a third one of the number of FIFO buffers includes subsets of data stored in the first type of memory that have been accessed twice during program operations performed on the memory; and
a fourth one of the number of FIFO buffers includes subsets of data stored in the first type of memory that have been accessed three or more times during program operations performed on the memory; and the first subset of data that has been accessed least frequently during program operations performed on the memory is a subset of data that has been removed from either the first one of the number of FIFO buffers or the second one of the number of FIFO buffers.

15. The method of claim 14, wherein the method includes:
updating data for a respective one of the number of subsets of data stored in the first type of memory indicating a frequency at which an address corresponding to that respective subset of data has been accessed during program operations performed on the memory if that respective subset of data has been removed from either the third one of the number of FIFO buffers or the fourth one of the number of FIFO buffers; and
not updating data for a respective one of the number of subsets of data stored in the first type of memory indicating a frequency at which an address corresponding to that respective subset of data has been accessed during program operations performed on the memory if that respective subset of data has been removed from either the first one of the number of FIFO buffers for the second one of the number of FIFO buffers.

16. The method of claim 14, wherein the method includes updating the data for the respective subsets of data stored in the first type of memory that have been removed from either the third one of the number of FIFO buffers or the fourth one of the number of FIFO buffers upon a predefined number of program operations being performed on the memory.

17. The method of claim 11, wherein the method includes:
storing data in a table in the first type of memory indicating a frequency at which an address corresponding to each respective one of the number of subsets of data stored in the first type of memory has been accessed during program operations performed on the memory; and
identifying the first subset of data among the number of subsets of data stored in the first type of memory that has been accessed least frequently during program operations performed on the memory using the data stored in the table.

18. The method of claim 17, wherein the method includes:
storing data in the table indicating each respective one of the number of subsets of data is stored in the first type of memory; and
storing data in the table indicating a location of each respective one of the number of subsets of data stored in the first type of memory.

19. The method of claim 17, wherein the data stored in the table indicates a number of possible frequencies at which the address corresponding to each respective one of the number of subsets of data stored in the first type of memory may have been accessed, wherein:
data indicating a first of the number of possible frequencies indicates that that respective subset of data stored in the first type of memory has been relocated from the second type of memory to the first type of memory and has not been accessed during program operations performed on the memory subsequent to being relocated;
data indicating a second of the number of possible frequencies indicates that that respective subset of data stored in the first type of memory has been accessed once during program operations performed on the memory;
data indicating a third of the number of possible frequencies indicates that that respective subset of data stored in the first type of memory has been accessed twice during program operations performed on the memory; and
data indicating a fourth of the number of possible frequencies indicates that that respective subset of data stored in the first type of memory has been accessed three or more times during program operations performed on the memory.

20. The method of claim 19, wherein the method includes periodically updating the data in the table indicating the frequency at which the address corresponding to each respective one of the number of subsets of data stored in the first type of memory has been accessed during program operations performed on the memory, wherein updating the data includes:
changing the data for a respective subset of data stored in the first type of memory from data indicating the fourth of the number of possible frequencies to data indicating the third of the number of possible frequencies;
changing the data for a respective subset of data stored in the first type of memory from data indicating the third of the number of possible frequencies to data indicating the second of the number of possible frequencies; and
not changing the data for a respective subset of data stored in the first type of memory from data indicating the second of the number of possible frequencies or the first of the number of possible frequencies.

21. A method for operating memory, comprising:
setting a threshold amount of data for determining whether to relocate data stored in a first type of memory to a second type of memory;
determining whether an amount of data sensed during a sense operation performed on a first subset of data stored in the first type of memory meets or exceeds the threshold amount of data;
relocating the first subset of data from the first type of memory to the second type of memory upon determining the amount of data does not meet or exceed the threshold amount of data;
identifying a second subset of data stored in the second type of memory to relocate to the first type of memory upon determining that the second subset of data has been accessed least frequently during program operations performed on the memory; and
relocating the second subset of data from the second type of memory to the first type of memory.

22. The method of claim 21, wherein:
the first subset of data is one subset of data in a group of subsets of data stored in the first type of memory; and
the method includes relocating the group of subsets of data from the first type of memory to the second type of memory upon determining the amount of data does not meet or exceed the threshold amount of data.

23. The method of claim 22, wherein a size of the group of subsets of data is equal to a size of a page of data stored in the first type of memory.

24. The method of claim 21, wherein relocating the first subset of data from the first type of memory to the second type of memory includes:
performing a program operation to program the data sensed during the sense operation to the second type of memory; and
updating location data for the first subset of data with a location in the second type of memory to which the sensed data is programed.

25. The method of claim 24, wherein relocating the first subset of data from the first type of memory to the second type of memory includes invalidating the data stored in the first subset of data in the first type of memory.

26. An apparatus, comprising:
a memory, wherein the memory includes a first type of memory and a second type of memory; and
a controller configured to:
identify subsets of data stored in the first type of memory to relocate to the second type of memory upon determining addresses corresponding to the subsets of data stored in the first type of memory have been accessed least frequently during program operations performed on the memory;
set a threshold amount of data for determining whether to relocate data stored in the second type of memory to the first type of memory;
identify subsets of data stored in the second type of memory to relocate to the first type of memory upon determining an amount of data sensed during sense operations performed on the subsets of data stored in the second type of memory does not meet or exceed the threshold amount of data; and
initiate a relocation of the identified subsets of data stored in the second type of memory from the second type of memory to the first type of memory upon determining the amount of data sensed during the sense operations does not meet or exceed the threshold amount of data.

27. The apparatus of claim 26, wherein:
the first type of memory is storage class memory; and
the second type of memory is flash memory.

28. The apparatus of claim 26, wherein the memory includes less of the first type of memory than the second type of memory.

29. The apparatus of claim 26, wherein the subsets of data stored in the first type of memory and the second type of memory include user data, metadata, and/or error correction code data.

30. The apparatus of claim 26, wherein the controller includes:
a first module configured to identify the subsets of data stored in the first type of memory to relocate to the second type of memory; and
a second module configured to identify the subsets of data stored in the second type of memory to relocate to the first type of memory.

31. The apparatus of claim 26, wherein the controller is configured to identify the subsets of data stored in the first type of memory to relocate to the second type of memory upon an amount of data stored in the first type of memory meeting or exceeding a predefined threshold.

32. The apparatus of claim 26, wherein the controller is configured to, upon identifying the subsets of data stored in the first type of memory to relocate to the second type of memory:
perform a sense operation to sense the data stored in the identified subsets of data in the first type of memory;
perform a program operation to program the sensed data to the second type of memory;
update location data for the identified subsets of data with a location in the second type of memory to which the sensed data is programed; and
invalidate the data stored in the identified subsets of data in the first type of memory.

33. The apparatus of claim 26, wherein the controller is configured to, upon identifying the subsets of data stored in the first type of memory to relocate to the second type of memory:
retrieve a location in the second type of memory where a backup copy of the data stored in the identified subsets of data is stored;
update location data for the identified subsets of data with the retrieved location; and
invalidate the data stored in the identified subsets of data in the first type of memory.

* * * * *